US012802930B2

(12) United States Patent
Jung et al.

(10) Patent No.: US 12,802,930 B2
(45) Date of Patent: Nov. 17, 2026

(54) RF GENERATOR WITH CARBONIZATION PREVENTION SYSTEM

(71) Applicant: SAMSUNG ELECTRONICS CO., LTD., Suwon-si (KR)

(72) Inventors: Kwangyoung Jung, Suwon-si (KR); Youngmin Min, Osan-si (KR); Jungan Kwon, Osan-si (KR); Gillhoon Shin, Suwon-si (KR); Keechun Shim, Osan-si (KR); Daeseong Ha, Osan-si (KR); Kyoungsuk Kim, Suwon-si (KR); Seungmin Ryu, Suwon-si (KR); Hyunsuk Park, Suwon-si (KR); Jiho Uh, Suwon-si (KR); Hyunjoon Ohn, Suwon-si (KR); Hyeseon Lee, Suwon-si (KR)

(73) Assignees: SAMSUNG ELECTRONICS CO., LTD., Suwon-si (KR); Rftsi Co., Ltd., Osan-si (KR)

( * ) Notice: Subject to any disclaimer, the term of this patent is extended or adjusted under 35 U.S.C. 154(b) by 406 days.

(21) Appl. No.: 18/139,639

(22) Filed: Apr. 26, 2023

(65) Prior Publication Data

US 2023/0360881 A1 Nov. 9, 2023

(30) Foreign Application Priority Data

May 4, 2022 (KR) ........................ 10-2022-0055427

(51) Int. Cl.
*H01J 37/32* (2006.01)

(52) U.S. Cl.
CPC .................. *H01J 37/32082* (2013.01); *H01J 2237/24564* (2013.01); *H01J 2237/24585* (2013.01); *H01J 2237/334* (2013.01)

(58) Field of Classification Search
CPC ....... H01J 37/32082; H05H 1/00; H05H 7/02; H05B 6/6447; H05B 6/645; H05B 6/6458; H05B 6/6461
See application file for complete search history.

(56) References Cited

U.S. PATENT DOCUMENTS 5,889,466 A * 3/1999 Ferguson ............... B64D 47/00
307/118
9,092,959 B2 7/2015 Kim et al.
(Continued)

FOREIGN PATENT DOCUMENTS

JP 2017-221656 A 12/2017
KR 20-0420965 Y1 7/2006
(Continued)

*Primary Examiner* — Benyam Haile
(74) *Attorney, Agent, or Firm* — Sughrue Mion, PLLC

(57) ABSTRACT

A radio frequency (RF) generator including a carbonization prevention system includes a casing on which an intake fan and an interlock are mounted, an alternating current (AC) power supply, a power supply, a power amplifier (PA), a coupler provided between the PA and the RF output connector, and a control board that controls an amount of DC power output to the PA according to the calculated values. The carbonization prevention system detects smoke generated in the casing, measures a temperature and a humidity in the casing, and generates and transmits a control signal to the control board and an operation control signal to the interlock according to a reading result.

18 Claims, 4 Drawing Sheets

(56) References Cited

U.S. PATENT DOCUMENTS

| | | | | |
|---|---|---|---|---|
| 11,583,336 | B2 | 2/2023 | Brannan et al. | |
| 2005/0143133 | A1 * | 6/2005 | Bridgelall | H04L 67/12 455/562.1 |
| 2014/0125487 | A1 * | 5/2014 | Polak | G08B 17/113 73/28.01 |
| 2017/0333128 | A1 * | 11/2017 | Brannan | H05B 6/6447 |

FOREIGN PATENT DOCUMENTS

| | | | |
|---|---|---|---|
| KR | 10-0939084 | B1 | 1/2010 |
| KR | 10-1035248 | B1 | 5/2011 |
| KR | 10-1774299 | B1 | 9/2017 |
| KR | 10-2019-0103804 | A | 9/2019 |
| KR | 10-2318951 | B1 | 10/2021 |

* cited by examiner

RF GENERATOR WITH CARBONIZATION PREVENTION SYSTEM

CROSS-REFERENCE TO RELATED APPLICATION

This application is based on and claims priority under 35 U.S.C. § 119 to Korean Patent Application No. 10-2022-0055427, filed on May 4, 2022, in the Korean Intellectual Property Office, the disclosure of which is incorporated by reference herein in its entirety.

BACKGROUND

The present disclosure relates to a radio frequency (RF) generator including a carbonization prevention system and, more particularly, to an RF generator including a system for detecting whether smoke is generated, a temperature, and humidity in the RF generator in real time.

In general, an RF generator such as a high-frequency generation device or a plasma power supply device is a module that supplies power required to generate plasma by supplying gas to a vacuum chamber of thin-film or dry etching process equipment in a semiconductor manufacturing process.

When a high-frequency wave is generated and output, a large amount of heat is generated, and the heat may generate carbonization of various lines and components When such carbonization remains undetected, a fire may occur in the RF generator and serious damage to a semiconductor manufacturing process may be caused.

SUMMARY

It is an aspect to provide a radio frequency (RF) generator including a carbonization prevention system in which whether smoke is generated in the RF generator, a temperature, and humidity are detected in real time to determine whether ignition occurs, and when it is determined that ignition occurs, an operation of the RF generator is controlled to be immediately stopped and an alarm is made at the same time, to prevent a fire caused by the ignition of the RF generator.

It is another aspect to provide an RF generator including a carbonization prevention system in which an operation of the RF generator is controlled according to an internal temperature and relative humidity of the RF generator by controlling a temperature and humidity in the RF generator, to prevent serious damage such as malfunction or failure of internal components due to high temperature and high humidity.

According to an aspect of one or more embodiments, there is provided a radio frequency (RF) generator comprising a casing on which an intake fan and an interlock are mounted; an alternating current (AC) power supply mounted on the casing and configured to output AC power; a power supply configured to receive the AC power from the AC power supply, convert the AC power into direct current (DC) power, and output the DC power; a power amplifier provided in an upper inner space of the casing, the power amplifier configured to receive the DC power from the power supply, amplify RF output power of an RF output signal, and output the amplified RF output power; an RF output connector connected to the power amplifier to output the amplified RF output power; a coupler provided between the power amplifier and the RF output connector, the coupler configured to measure the amplified RF output power and transmit a measured value of the amplified RF output power; a control board configured to receive the measured value, calculate a total power, a reflection loss, and a standing wave ratio of the amplified RF output power, and control an amount of DC power output to the power amplifier based on the total power, the reflection loss, and the standing wave ratio; and a carbonization prevention system connected to the control board and the interlock, the carbonization prevention system configured to detect smoke generated in the casing, measure a temperature and a humidity in the casing, and generate and transmit a control signal to the control board and an operation control signal to the interlock, respectively, according to the temperature and the humidity, wherein, when the interlock receives both the operation control signal from the carbonization prevention system and an operation control signal from the control board, the interlock stops an operation of the AC power supply.

According to an aspect of one or more embodiments, there is provided a radio frequency (RF) generator comprising a casing on which an intake fan and an interlock are mounted, the casing including therein an alternating current (AC) power supply; a power amplifier provided in an upper inner space of the casing, the power amplifier configured to amplify RF output power of an RF output signal, based on AC power from the AC power supply, and output the amplified RF output power; a control board configured to calculate a total power, a reflection loss, and a standing wave ratio of the amplified RF output power, and control the power amplifier based on the total power, the reflection loss, and the standing wave ratio; and a carbonization prevention system connected to the control board and the interlock, the carbonization prevention system configured to detect when carbonization occurs in the casing, based on smoke in the casing and based on a temperature and a humidity in the casing, and generate and transmit a control signal to the control board and a first operation control signal to the interlock, respectively, when the carbonization occurs, wherein, when the interlock receives both the first operation control signal from the carbonization prevention system, and a second operation control signal from the control board that is based on the control signal, the interlock stops an operation of the AC power supply.

BRIEF DESCRIPTION OF THE DRAWINGS

Embodiments will be more clearly understood from the following detailed description taken in conjunction with the accompanying drawings, in which.

DETAILED DESCRIPTION

Figure 1:
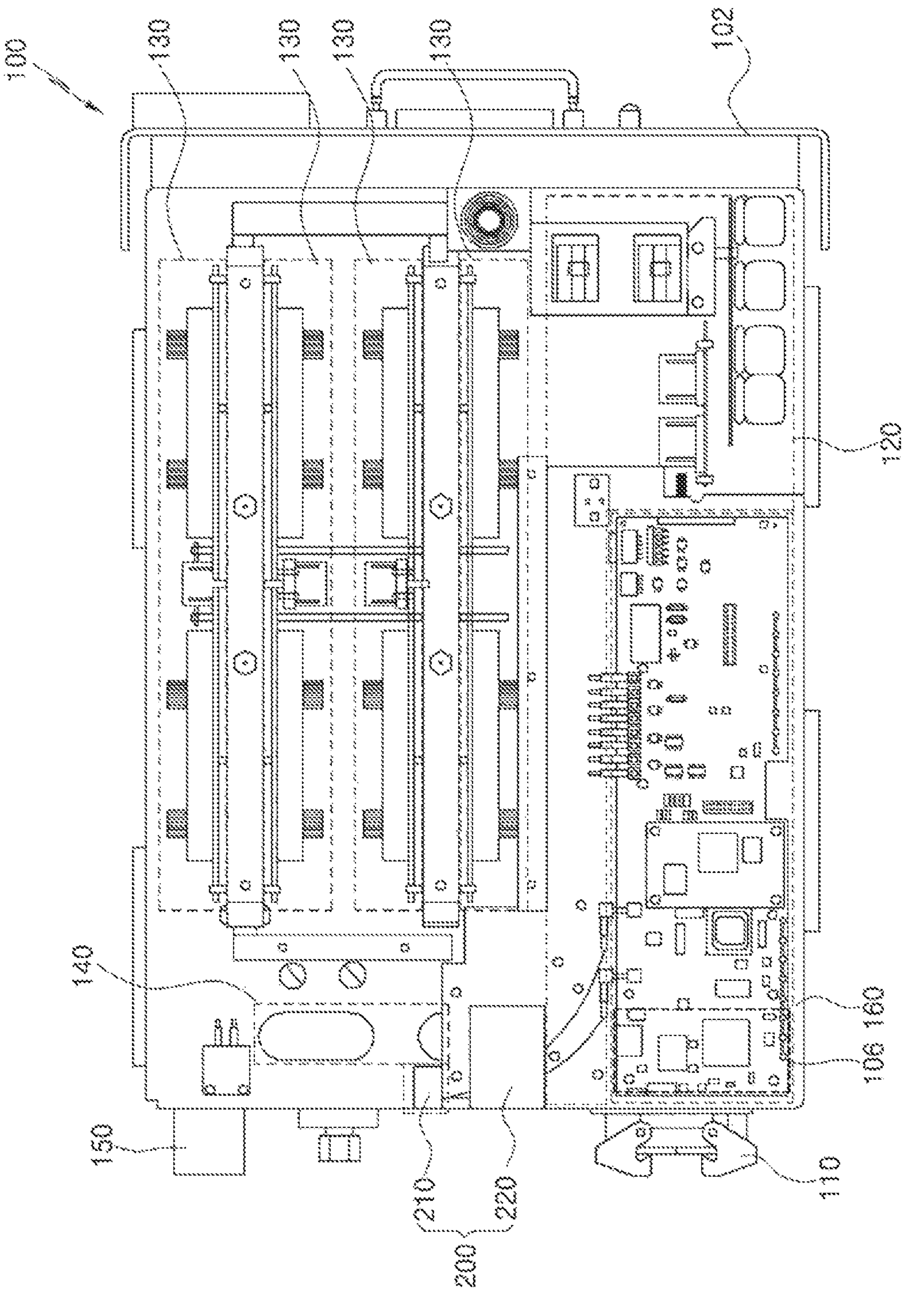
FIG. 1 is a view schematically illustrating an internal structure of a radio frequency (RF) generator including a carbonization prevention system, according to some embodiments.
Figure 2:
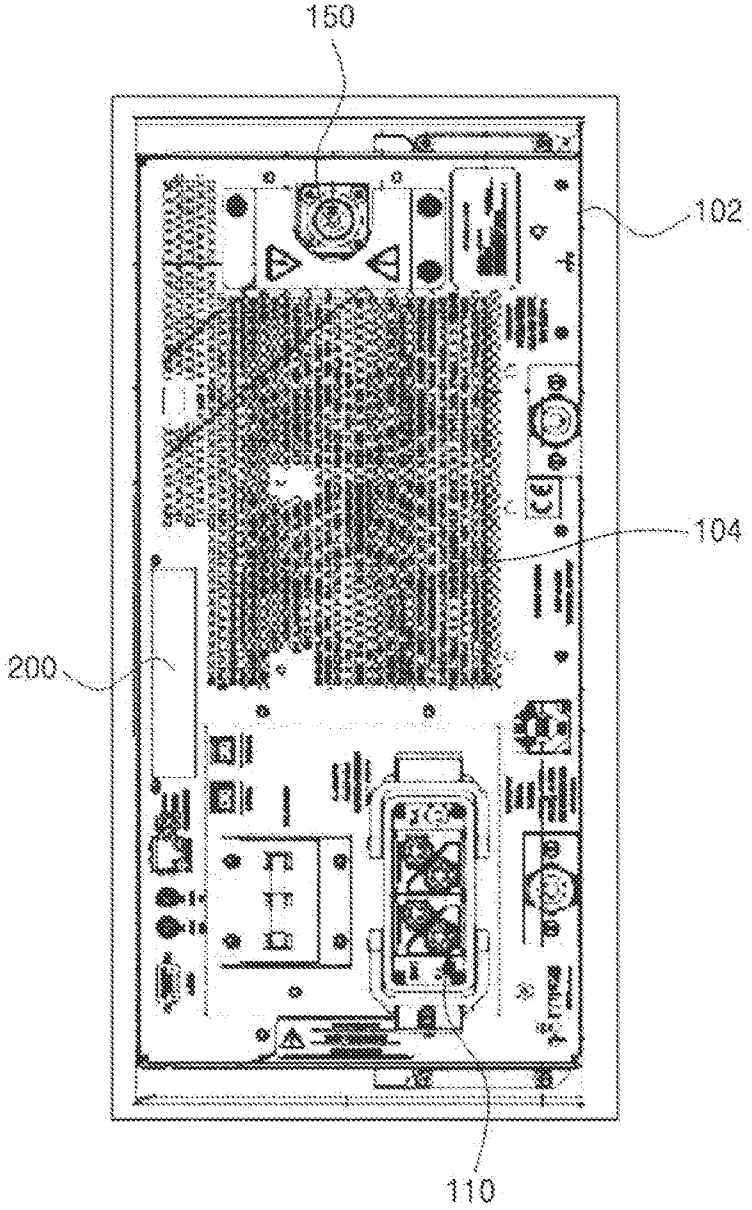
FIG. 2 is a front view illustrating an RF generator including a carbonization prevention system, according to some embodiments.

Aspects are not limited to the above aspects, and other unmentioned aspects may become apparent to one of ordinary skill in the art from the following descriptions of various embodiments.

As discussed above, an RF generator such as a high-frequency generation device or a plasma power supply device is a module that supplies power required to generate plasma by supplying gas to a vacuum chamber of thin-film or dry etching process equipment in a semiconductor manufacturing process.

RF generators are used in various ways according to a configuration of a plasma source of thin-film or dry etching equipment and process film deposition or etching, and form various product lines according to frequency and supply power size.

For example, in some cases, a high-frequency generation device may include a high-frequency generator provided in a case that generates and outputs a high-frequency wave, a matching circuit network that receives an output of the high-frequency generator and outputs a high-frequency wave by matching an impedance with a load, an adjustment circuit unit that independently adjusts a high-frequency output of the high-frequency generator and an impedance of the matching circuit network, and a panel unit connected to the adjustment circuit unit and including a high-frequency generator adjustment terminal configured to manually adjust a size of a high-frequency signal, a matching circuit network adjustment terminal configured to manually adjust a size of an impedance of the matching circuit network, and a high-frequency generator display means and a matching circuit network display means configured to display sizes of the high-frequency signal and the impedance.

However, in such a high-frequency generation device, when a high-frequency wave is generated and output, a large amount of heat is generated, and when damage is applied to various electric lines connected to the high-frequency generator, carbonization of not only an output line that outputs the high-frequency wave but also each of components constituting the high-frequency generator proceeds.

Because it is not detected whether carbonization occurs and proceeds, a fire may occur in an RF generator and serious damage to a semiconductor manufacturing process may be caused.

Embodiments will be described in detail with reference to the accompanying drawings. The same components in the drawings are denoted by the same reference numerals, and a repeated description thereof will be omitted.

As shown in the drawings, a radio frequency (RF) generator including a carbonization prevention system according to some embodiments includes a casing 102, an alternating current (AC) supply 110, a power supply 120, a plurality of power amplifiers (PAs) 130, a coupler 140, an output connector 150, a control board 160, a sensor module 210, and a microcontroller unit (MCU) 220. While FIG. 1 illustrates a plurality of power amplifiers (Pas) 130, this is only an example and, in some embodiments, a single power amplifier (PA) 130 may be provided.

Each of the components may be accommodated in the casing 102, and a plurality of intake fans 104 driven according to whether an operation control signal is received are provided on a rear surface of the casing 102. In some embodiments, an operation control signal may be provided to each of the plurality of intake fans 104. In some embodiments, the plurality of intake fans 104 may be driven by a single operation control signal.

Figure 3:
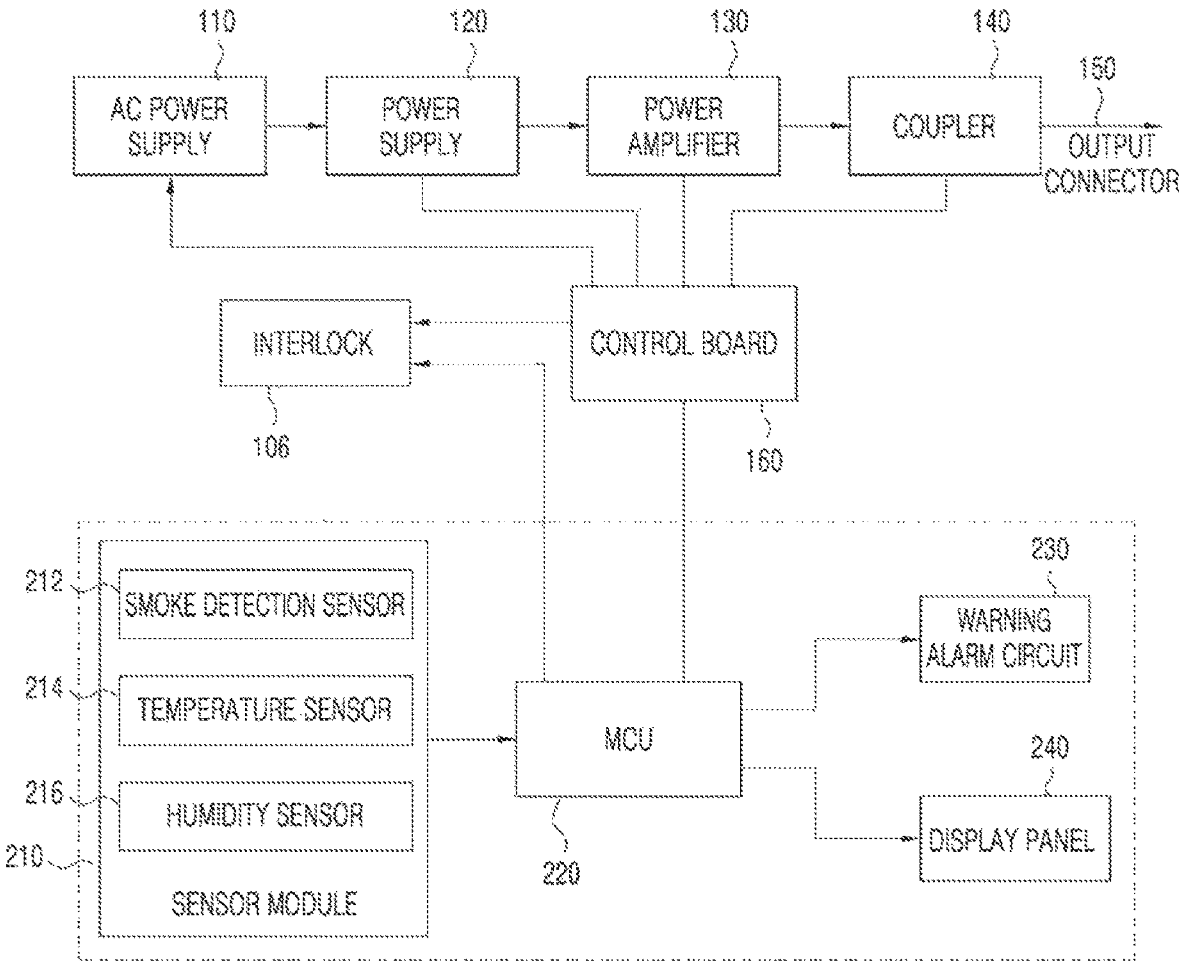
FIG. 3 is a block diagram illustrating an RF generator including a carbonization prevention system, according to some embodiments.

The casing 102 includes an interlock 106 (see FIG. 3) configured to receive an operation control signal from the control board 160 and the MCU 220 and stop the AC power supply 110 according to the received operation control signal.

In this case, when an operation control signal is received from both the control board 160 and the MCU 220, the interlock 106 may stop an operation of the RF generator by disconnecting the AC power supply 110. For example, in some embodiments, the interlock 106 may stop the operation of the RF generator by disconnecting the AC power supply 110 from an external power supply device to cut off AC power supply.

The AC power supply 110 is connected to the external power supply device to supply AC power and is coupled to a lower surface of a front side of the casing 102.

The AC power supply 110 is electrically connected to the control board 160 and configured to supply received AC power to the power supply 120 under the control of the control board 160.

In some embodiments, the AC power supply 110 is configured to cut off supply of received external power to the power supply 120 under the control of the interlock 106.

The power supply 120 may be located in a lower space of the casing 102 and located on and attached to a rear surface of the control board 160, and configured to receive AC power from the AC power supply 110 under the control of the control board 160, convert the AC power into direct current (DC) power, supply the DC power to each component of the RF generator to drive the component, and also supply the DC power to the PA 130 to amplify RF output power corresponding to an RF signal.

The power supply 120 is connected to a display panel 240 (see FIG. 4) and the intake fan 104 provided on the casing 102 to supply DC power. The power supply 120 is electrically connected to the PA 130 under the control of the control board 160 to control the amount of DC power output to the PA 130.

The PA 130 is configured to receive DC power output from the power supply 120. The PA 130 amplifies the input DC power, and amplify RF output power of an RF output signal based on the amplified DC power.

The PA 130 is located in an upper inner space of the casing 102. The PA 130 is located over the power supply 120, and is electrically connected to the power supply 120 and the control board 160.

The PA 130 is configured to output the amplified RF output power to the RF output connector 150 through the coupler 140.

The coupler 140 may be a directional coupler. The coupler 140 is configured to measure RF output power output from the PA 130, and transmit a value of the measured RF output power to the control board 160 to calculate a total power, a reflection loss, and a standing wave ratio of the RF output power.

The coupler 140 includes an input port connected to the PA 130 and an output port connected to the RF output connector 150. The coupler 140 is configured to measure RF output power of an RF output signal output to the output port. The coupler 140 is configured to read a reflection signal of the measured RF output power, and transmit the reflection signal to the control board 160.

The RF output connector 150 is connected to equipment such as a semiconductor manufacturing device, to output RF output power of an RF output signal passing through the coupler 140 to the equipment.

The control board 160 is electrically connected to the AC power supply 110, the power supply 120, the PA 130, the coupler 140, and the output connector 150 to control whether to drive each of the AC power supply 110, the power supply 120, the PA 130, the coupler 140, and the output connector 150. The control board 160 is connected to the MCU 220 via a network to control whether to operate and turn on/off the AC power supply 110 and the power supply 120 according to a control signal transmitted from the MCU 220.

The control board 160 is configured to control whether to connect the AC power supply 110 to the external power supply device, and to control whether to supply AC power supplied from the AC power supply 110 to the power supply 120.

The control board 160 is configured to control the amount of AC power supplied to the power supply 120, and to control the amount of DC power output to the PA 130.

In this case, the control board 160 may control the output amount of the DC power so that output power is amplified through the PA 130 and an RF output signal is amplified based on the amplified DC power.

The control board 160 is configured to receive a measured value of RF output power from the coupler 140, read the measured value, calculate a total power, a reflection loss, and a standing wave ratio of the RF output power. The control board 160 is configured to control the amount of DC power output to the PA 130 according to the total power, the reflection loss, and the standing wave ratio of the RF output power.

When the control signal transmitted from the MCU 220 includes an operation stop signal, the control board 160 may control the AC supply 110, the power supply 120, the PA 130, and the coupler 140 to stop and/or simultaneously stop the AC supply 110, the power supply 120, the PA 130, and the coupler 140. Through this, the RF generator can reduce damage applied to each component including the AC supply 110, the power supply 120, the PA 130, and the coupler 140 by carbonization, and prevent a fire caused by the carbonization.

In this case, when the operation stop signal is included, the control board 160 may generate an operation control signal for stopping an operation of the AC power supply 110 and may transmit the operation control signal to the interlock 106. In other words, when the control board 160 receives the operation stop signal from the MCU 220, the control board 160 may generate the operation control signal for stopping the operation of the AC power supply 110 and may transmit the operation control signal to the interlock 106.

In some embodiments, the control board 160 may be configured to, when a driving control signal of the intake fan 104 is included in a control signal transmitted from the MCU 220, control whether to drive the intake fan 104 and a driving strength of the intake fan 104. Thus, in some embodiments, the control board 160 may be configured to discharge smoke detected in the casing 102 of the RF generator to the outside of the casing 102.

The RF generator according to some embodiments may further include a carbonization prevention system 200 mounted in the casing 102 of the RF generator. The carbonization prevention system 200 may be configured to, when smoke is generated due to carbonization initial degradation in the RF generator, detect the smoke and transmit, to the control board 160, a control signal for stopping an operation of the RF generator to prevent a fire caused by the carbonization of the RF generator.

Figure 4:
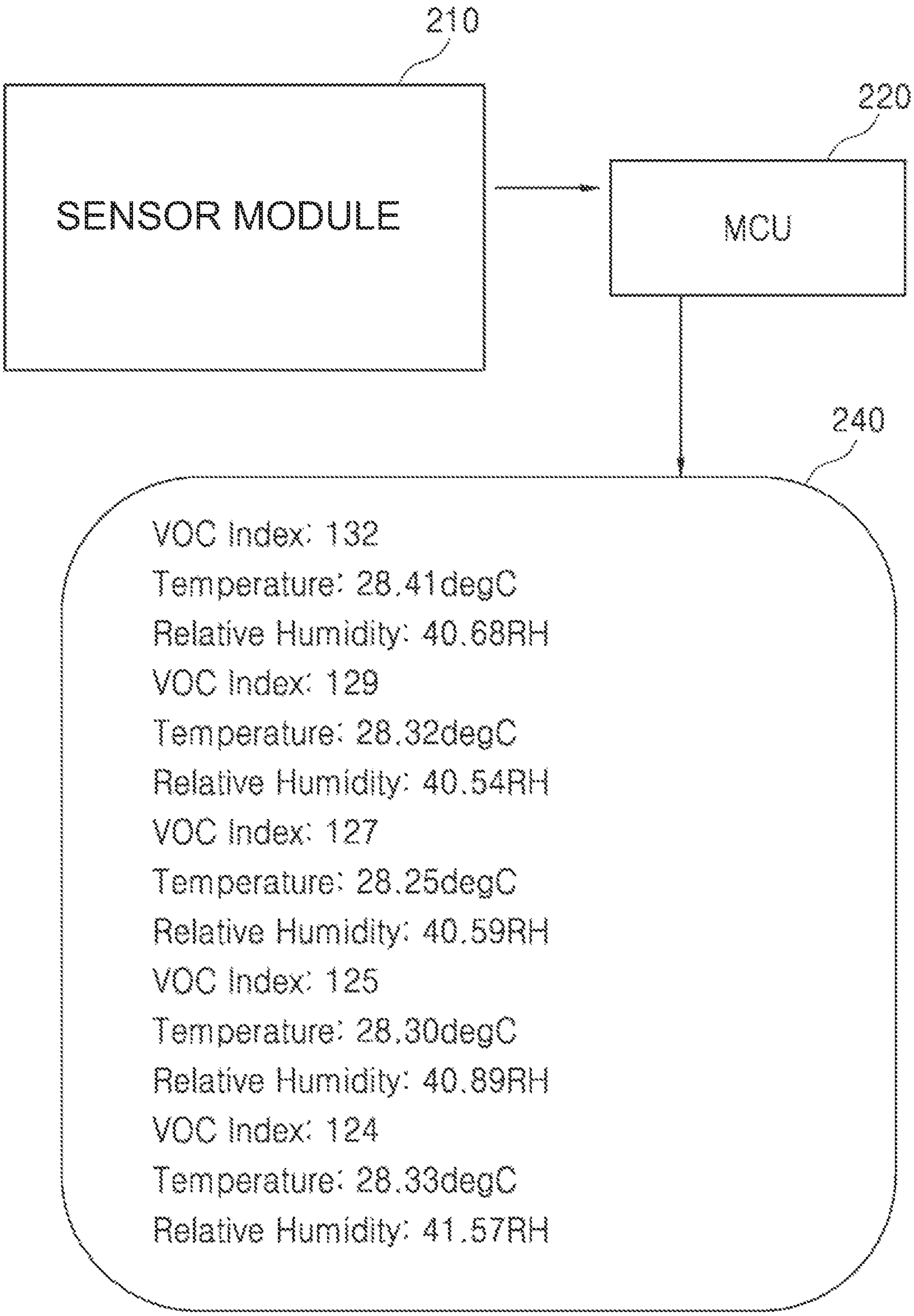
FIG. 4 illustrates a circuit diagram of a sensor module of a carbonization prevention system and a view schematically illustrating state information in which a measurement value measured by a sensor module is displayed on a display panel, according to some embodiments.

In some embodiments, the carbonization prevention system 200 may include the sensor module 210 the microcontroller unit (MCU) 220, a warning alarm circuit 230 and a display panel 240. The sensor module 210 may be configured to detect whether smoke is generated in the casing 102 of the RF generator, detect a temperature and humidity in the casing 102 of the RF generator, and transmit the temperature and humidity. The microcontroller unit (MCU) 220 may be connected to the sensor module 210 via a network (e.g., a bus within the RF generator). The microcontroller unit (MCU) 220 may be configured to analyze detection data transmitted from the sensor module 210 and generate and transmit a control signal regarding whether to stop an operation of the RF generator and whether to transmit a warning message. The warning alarm circuit 230 may be configured to output a warning sound under the control of the MCU 220 when carbonization occurs to rapidly respond to a fire. The display panel 240 may be configured to output in real time information about the amount of smoke, a temperature, and humidity in the RF generator measured by the sensor module 210 in real time and set reference data on whether to transmit the control signal. As shown in FIG. 4, measured values of temperature and relative humidity and Volatile Organic Compounds (VOC) index corresponding to a division number of the measured values may be displayed on the display panel 240.

The sensor module 210 includes a smoke detection sensor 212, a temperature sensor 214, and a humidity sensor 216. The smoke detection sensor 212 may be configured to detect whether smoke is generated in the casing 102 of the RF generator and transmit a smoke detection signal regarding whether smoke is generated to the MCU 220. The temperature sensor 214 may be configured to measure a temperature in the casing 102 of the RF generator and transmit measured temperature information to the MCU 220. The humidity sensor 216 may be configured to measure humidity in the casing 102 of the RF generator and transmit measured humidity information to the MCU 220.

The smoke detection sensor 212 may be configured to, when smoke is detected, measure the amount of detected smoke and transmit information about whether smoke is generated and a smoke amount measurement value to the MCU 220.

In this case, when it is detected that smoke is generated, the smoke detection sensor 212 may measure the amount of smoke detected in real time and may transmit information about the measured amount of smoke to the MCU 220.

The temperature sensor 214 and the humidity sensor 216 respectively may transmit temperature and humidity information in the casing 102 of the RF generator in real time.

In some embodiments, the sensor module 210 may further include a moisture detection sensor configured to detect whether there is moisture in the casing 102 of the RF generator, and when there is moisture, generate a moisture measurement value by measuring the amount of moisture, and transmit the generated moisture measurement value to the MCU 220.

The moisture detection sensor may include a water leak sensor, and may be selectively driven according to humidity information transmitted from the humidity sensor 216 under the control of the MCU 220.

That is, the moisture detection sensor may be driven under the control of the MCU only when humidity transmitted from the humidity sensor 216 is higher than a humidity setting value set through manipulation of the display panel 240.

The MCU 220 is an element connected to the sensor module 210, the control board 160, and the interlock 106 via a network (e.g., a bus). The MCU 220 may be configured to generate a control signal transmitted to the control board 160 and an operation control signal transmitted to the interlock 106 based on data from the sensor module 210, control an operation of the warning alarm circuit 230 when the control signal and the operation control signal are generated, and set a generation condition value of the control signal and the operation control signal based on reference data input through the display panel 240.

The MCU 220 is configured to communicate with the sensor module 210 in real time, set a smoke amount reference value, a temperature reference value, and a humidity reference value included in reference data by reading the reference data transmitted from the display panel 240, and generate a generation condition value including the set reference values.

The MCU 220 determines whether pieces of data from the sensor module 210, that is, presence of smoke and a smoke amount measurement value received from the smoke detection sensor 212 and temperature information and humidity information respectively received from the temperature sensor 214 and the humidity sensor 216, respectively, exceed the generation condition value, generates a control signal and an operation control signal only when the pieces of data exceed the generation condition value, and transmits the control signal and the operation control signal to the control board 160 and the interlock 106, to prevent a fire in the RF generator.

In this case, the MCU 220 controls the warning alarm circuit 230 to operate, when the control signal and the operation control signal are generated.

The warning alarm circuit 230 may include an LED or a speaker and may be configured to give a warning by blinking or by voice or sound, but embodiments are not limited thereto.

In some embodiments, the MCU 220 may control an operation of the sensor module 210 when the RF generator is initially driven, may store initial data transmitted from the sensor module 210, and may generate change amount data on a change amount of whether smoke is generated and a smoke amount measurement value and temperature and humidity information by comparing the stored initial data with real-time data transmitted by the sensor module 210.

In this case, when the generated change amount data exceeds an allowable range, the MCU 220 may generate an operation control signal and transmit the operation control signal to the interlock 106, and may control the warning alarm circuit 230 to operate.

The allowable range may be a range of about 10% or more of the generation condition value. When a change amount of the change amount data is 10% or more of the generation condition value, the MCU 220 may determine that there is a risk of fire and may generate and transmit an operation control signal.

However, embodiments are not limited thereto, and the allowable range may vary according to a size of the RF generator.

While various embodiments have been particularly shown and described with reference to the drawings, it will be understood that various changes in form and details may be made therein without departing from the spirit and scope of the following claims. Accordingly, the embodiments should be considered in descriptive sense only and not for purposes of limitation of the scope of the present disclosure. The scope of the present disclosure is defined not by the detailed description but by the appended claims, and all differences within the scope will be construed as being included in the present disclosure.

What is claimed is:

1. A radio frequency (RF) generator comprising:

a casing on which an intake fan and an interlock are mounted;

an alternating current (AC) power supply mounted on the casing and configured to receive AC power from an external power supply device and output the AC power;

a power supply provided separately from the AC power supply and configured to receive the AC power from the AC power supply, convert the AC power into direct current (DC) power, and output the DC power;

a power amplifier provided in an upper inner space of the casing, the power amplifier configured to receive the DC power from the power supply, amplify RF output power of an RF output signal, and output the amplified RF output power;

an RF output connector connected to the power amplifier to output the amplified RF output power;

a coupler provided between the power amplifier and the RF output connector, the coupler configured to measure the amplified RF output power and transmit a measured value of the amplified RF output power;

a control board configured to receive the measured value, calculate a total power, a reflection loss, and a standing wave ratio of the amplified RF output power, and control an amount of DC power output to the power amplifier based on the total power, the reflection loss, and the standing wave ratio; and a carbonization prevention system connected to the control board and the interlock, the carbonization prevention system comprising:

a sensor module configured to detect smoke generated in the casing and generate a smoke amount measurement value, detect a temperature in the casing and generate temperature information, detect a humidity in the casing and generate humidity information; and a microcontroller unit (MCU) configured to generate a control signal and an operation control signal, based on a combination of the smoke amount measurement value, the temperature information, and the humidity information, and transmit the control signal to the control board and the operation control signal to the interlock;

wherein, when the interlock receives both the operation control signal from the carbonization prevention system and an operation control signal from the control board, the interlock stops an operation of the RF generator by disconnecting the AC power supply from the external power supply device to cut off the AC power supply, wherein the operation control signal from the control board is based on the control signal transmitted to the control board from the carbonization prevention system, wherein the sensor module comprises:

a smoke detection sensor configured to detect whether the smoke is generated in the casing and transmit, to the MCU, a detection signal regarding whether the smoke is generated and, when the smoke is detected, to measure an amount of the smoke and transmit the smoke amount measurement value to the MCU, a temperature sensor configured to measure the temperature in the casing and transmit, to the MCU, the temperature information, based on the temperature, and a humidity sensor configured to measure the humidity in the casing and transmit, to the MCU, the humidity information, based on the humidity.

2. The RF generator of claim 1, wherein the carbonization prevention system comprises:

a warning alarm circuit configured to output a warning sound under control of the MCU based on the control signal from the MCU; and a display panel configured to output information about the amount of smoke and the temperature and the humidity in the casing in real time, and set reference data on whether to transmit the control signal.

3. The RF generator of claim 1, wherein the MCU is further configured to:

read reference data including a smoke amount reference value, a temperature reference value, and a humidity reference value, and generate a generation condition value including the smoke amount reference value, the temperature reference value, and the humidity reference value;

compare the generation condition value with data including the smoke amount measurement value, the temperature information, and the humidity information from the sensor module and determine whether the data exceed the generation condition value; and only when the data exceeds the generation condition value, generate the control signal and the operation control signal and transmit the control signal and the operation control signal to the control board and the interlock, respectively.

4. The RF generator of claim 3, wherein the MCU is further configured to:

compare initial data from the sensor module with real-time data from the sensor module and generate change amount data on a change amount of whether the smoke is generated, the smoke amount measurement value, the temperature information, and the humidity information; and when the generated change amount data exceeds an allowable range, generate the operation control signal, transmit the operation control signal to the interlock, and control a warning alarm circuit to operate.

5. The RF generator of claim 4, wherein the allowable range is 10% or more of the generation condition value.

6. The RF generator of claim 1, wherein the sensor module further comprises a moisture detection sensor including a water leak sensor and configured to detect whether there is moisture in the casing, based on detecting the moisture, measure an amount of the moisture and generate a moisture measurement value, and transmit the moisture measurement value to the MCU, and wherein the MCU is configured to generate the control signal and the operation control signal, based on the smoke amount measurement value, the temperature information, the humidity information, and the moisture measurement value.

7. A radio frequency (RF) generator comprising a casing on which an intake fan and an interlock are mounted, the casing including therein:

an alternating current (AC) power supply configured to receive AC power from an external power supply device and output the AC power;

a power amplifier provided separately from the AC power supply and in an upper inner space of the casing, the power amplifier configured to amplify RF output power of an RF output signal, based on the AC power from the AC power supply, and output the amplified RF output power;

a control board configured to calculate a total power, a reflection loss, and a standing wave ratio of the amplified RF output power, and control the power amplifier based on the total power, the reflection loss, and the standing wave ratio;

a carbonization prevention system connected to the control board and the interlock, the carbonization prevention system comprising:

a sensor module configured to detect smoke generated in the casing and generate a smoke amount measurement value, detect a temperature in the casing and generate temperature information, and detect a humidity in the casing and generate humidity information; and a microcontroller unit (MCU) configured to generate a control signal and a first operation control signal, based on a combination of the smoke amount measurement value, the temperature information, and the humidity information, and to transmit the control signal to the control board and the first operation control signal to the interlock, wherein, when the interlock receives both the first operation control signal from the carbonization prevention system, and a second operation control signal from the control board that is based on the control signal, the interlock stops an operation of the RF generator by disconnecting the AC power supply from the external power supply device to cut off the AC power supply, and wherein the sensor module comprises:

a smoke detection sensor configured to detect whether the smoke is generated in the casing and transmit, to the MCU, a detection signal regarding whether the smoke is generated and, when the smoke is detected, to measure an amount of the smoke and transmit the smoke amount measurement value to the MCU, a temperature sensor configured to measure the temperature in the casing and transmit, to the MCU, the temperature information, based on the temperature, and a humidity sensor configured to measure the humidity in the casing and transmit, to the MCU, the humidity information, based on the humidity.

8. The RF generator of claim 7, wherein the carbonization prevention system comprises:

a warning alarm circuit configured to output a warning sound under control of the MCU based on the control signal; and a display panel configured to output information about the amount of the smoke and the temperature and the humidity in the casing in real time, and set reference data on whether to transmit the control signal and the first operation control signal.

9. The RF generator of claim 8, wherein the MCU is further configured to:

compare initial data from the sensor module with real-time data from the sensor module and generate change amount data on a change amount of the smoke; and when the generated change amount data exceeds an allowable range, generate the first operation control signal, transmit the first operation control signal to the interlock, and control the warning alarm circuit to operate.

10. The RF generator of claim 9, wherein the allowable range is 10% or more of a generation condition value.

11. The RF generator of claim 7, wherein the MCU is further configured to:

read reference data including a smoke amount reference value, a temperature reference value, and a humidity reference value, and generate a generation condition value including the smoke amount reference value, the temperature reference value, and the humidity reference value;

compare the generation condition value with data including the smoke amount measurement value, the temperature information, and the humidity information from the sensor module and determine whether the data exceed the generation condition value; and only when the data exceeds the generation condition value, generate the control signal and the first operation control signal and transmit the control signal and the first operation control signal to the control board and the interlock, respectively.

12. The RF generator of claim 7, wherein the sensor module further comprises a moisture detection sensor including a water leak sensor and configured to detect whether there is moisture in the casing, based on detecting the moisture, measure an amount of the moisture and generate a moisture measurement value, and transmit the moisture measurement value to the MCU, and wherein the MCU is configured to generate the control signal and the first operation control signal, based on the smoke amount measurement value, the temperature information, the humidity information, and further based on the moisture measurement value.

13. A radio frequency (RF) generator comprising a casing on which an intake fan and an interlock are mounted, the casing including therein:

an alternating current (AC) power supply;

a power amplifier provided in an upper inner space of the casing, the power amplifier configured to amplify RF output power of an RF output signal, based on AC power from the AC power supply, and output the amplified RF output power;

a control board configured to calculate a total power, a reflection loss, and a standing wave ratio of the amplified RF output power, and control the power amplifier based on the total power, the reflection loss, and the standing wave ratio; and a carbonization prevention system connected to the control board and the interlock, the carbonization prevention system comprising:

a sensor module comprising a smoke detection sensor configured to, when smoke is detected in the casing, measure a smoke amount measurement value of the smoke in the casing, a temperature sensor configured to measure a temperature in the casing and generate temperature information, and a humidity sensor configured to measure a humidity in the casing and generate humidity information, and a microcontroller unit (MCU) configured to receive the smoke amount measurement value, the temperature information and the humidity information from the sensor module, generate a control signal and a first operation control signal, based on a combination of the smoke amount measurement value, the temperature information, and the humidity information from the sensor module, and transmit the control signal to the control board and the first operation control signal to the interlock, wherein, when the interlock receives both the first operation control signal from the carbonization prevention system, and a second operation control signal from the control board that is based on the control signal, the interlock stops an operation of the AC power supply.

14. The RF generator of claim 13, wherein the carbonization prevention system comprises:

a warning alarm circuit configured to output a warning sound under control of the MCU based on the control signal; and a display panel configured to output information about an amount of the smoke and the temperature and the humidity in the casing in real time, and set reference data on whether to transmit the control signal and the first operation control signal.

15. The RF generator of claim 14, wherein the MCU is further configured to:

compare initial data from the sensor module with real-time data from the sensor module and generate change amount data on a change amount of the smoke; and when the generated change amount data exceeds an allowable range, generate the first operation control signal, transmit the first operation control signal to the interlock, and control the warning alarm circuit to operate.

16. The RF generator of claim 15, wherein the allowable range is 10% or more of a generation condition value.

17. The RF generator of claim 13, wherein the MCU is further configured to:

read reference data including a smoke amount reference value, a temperature reference value, and a humidity reference value, and generate a generation condition value including the smoke amount reference value, the temperature reference value, and the humidity reference value;

compare the generation condition value with data including the smoke amount measurement value, the temperature information, and the humidity information from the sensor module and determine whether the data exceed the generation condition value; and only when the data exceeds the generation condition value, generate the control signal and the first operation control signal and transmit the control signal and the first operation control signal to the control board and the interlock, respectively.

18. The RF generator of claim 13, wherein the sensor module further comprises a moisture detection sensor configured to detect moisture in the casing, and generate a moisture measurement value, and wherein the MCU is configured to receive the moisture measurement value and generate the control signal and the first operation control signal, based on the combination of the smoke amount measurement value, the temperature information, the humidity information, and the moisture measurement value.

* * * * *